Figure 1:
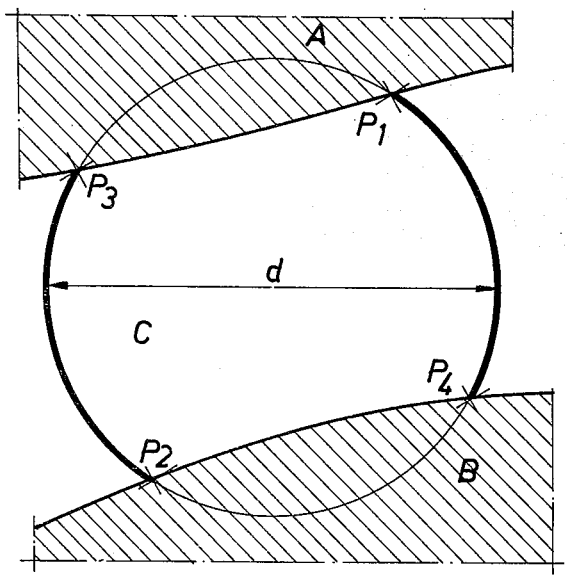

United States Patent [19]

Danielsson et al.

[11] 4,170,003

[45] Oct. 2, 1979

[54] DEVICE FOR EXAMINATION OF DISTANCES IN A PICTURE

[76] Inventors: Per-Erik Danielsson, Hedborns gata 30, S-582 49 Linköping; Carl A. B. Kruse, Kindlyckevägen 9, S. 590 41 Rimforsa; Michael A. X. Pääbo, Björnkärrsgatan 7B:12, S-582 48 Linköping, all of Sweden

[21] Appl. No.: 874,646

[22] Filed: Feb. 13, 1978

[30] Foreign Application Priority Data

Feb. 11, 1977 [SE] Sweden .............................. 7701565
Dec. 2, 1977 [SE] Sweden .............................. 7713716

[51] Int. Cl.² .............................................. G06K 9/12
[52] U.S. Cl. ........................ 340/146.3 MA; 250/560; 340/146.3 H; 340/146.3 Y; 356/372
[58] Field of Search ............ 340/146.3 MA, 146.3 F, 340/146.3 AC, 146.3 AE, 146.3 E, 146.3 H, 146.3 Y; 235/92 PC; 250/202, 312, 559–561, 578, 567; 356/102, 156, 157

[56] References Cited

U.S. PATENT DOCUMENTS

| 3,255,437 | 6/1966 | Singer ..................... 340/146.3 MA |
| 3,395,283 | 7/1968 | Sefton et al. ........................ 250/561 |
| 3,671,941 | 6/1972 | Takahashi et al. ........ 340/146.3 AE |
| 3,887,762 | 6/1975 | Uno et al. ....................... 235/92 PC |
| 3,890,596 | 6/1975 | Beun et al. ................ 340/146.3 MA |
| 4,021,778 | 5/1977 | Ueda et al. ................. 340/146.3 AC |

FOREIGN PATENT DOCUMENTS 1431438  4/1976  United Kingdom .......... 340/146.3 AC

*Primary Examiner*—Leo H. Boudreau
*Attorney, Agent, or Firm*—Seidel, Gonda, Goldhammer & Panitch

[57] ABSTRACT

A device for the examination of distances between two spaced apart objects in a two-dimensional digitized picture. A logical unit senses the binary values of the elements of a test pattern. Based on certain transitions in the values of the test pattern elements, the unit determines whether the distance between the two objects is less than a smallest allowable distance. A warning signal is generated if the objects are closer than the smallest allowable distance.

14 Claims, 19 Drawing Figures

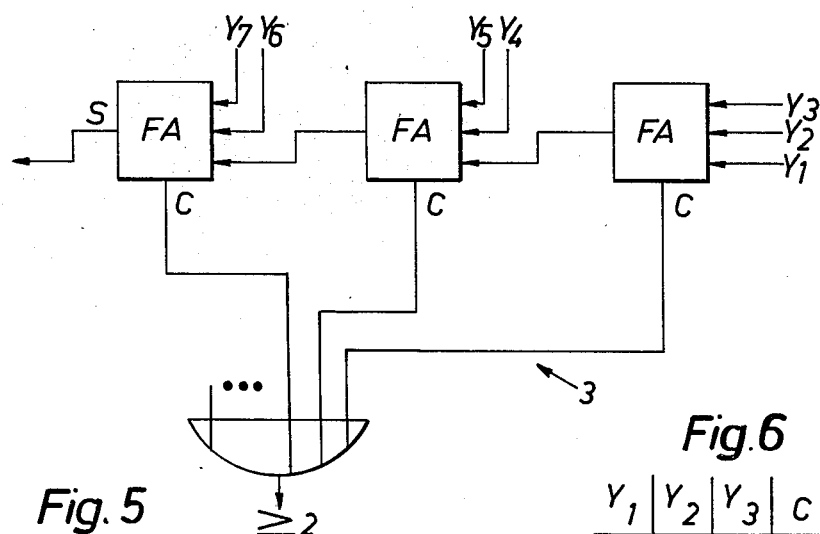
Fig. 4
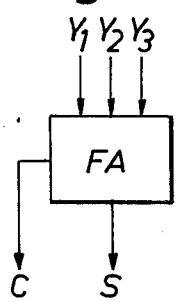
Fig. 5
Fig. 6
| $Y_1$ | $Y_2$ | $Y_3$ | C | S |
|---|---|---|---|---|
| 0 | 0 | 0 | 0 | 0 |
| 0 | 0 | 1 | 0 | 1 |
| 0 | 1 | 0 | 0 | 1 |
| 0 | 1 | 1 | 1 | 0 |
| 1 | 0 | 0 | 0 | 1 |
| 1 | 0 | 1 | 1 | 0 |
| 1 | 1 | 0 | 1 | 0 |
| 1 | 1 | 1 | 1 | 1 |
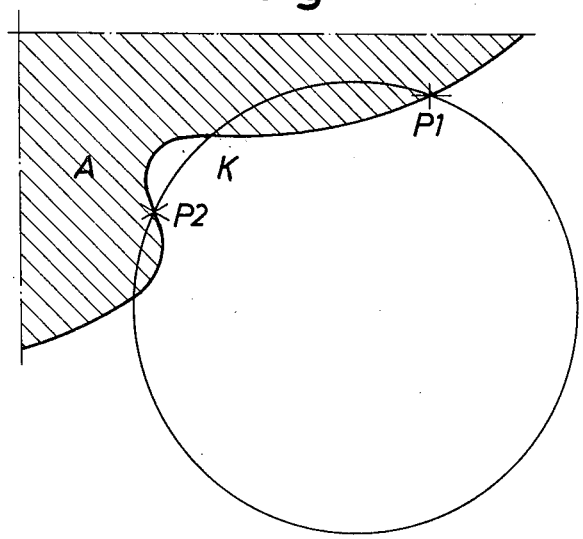
Fig. 7
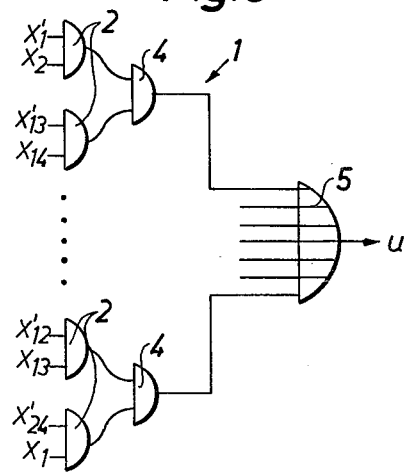
Fig. 8

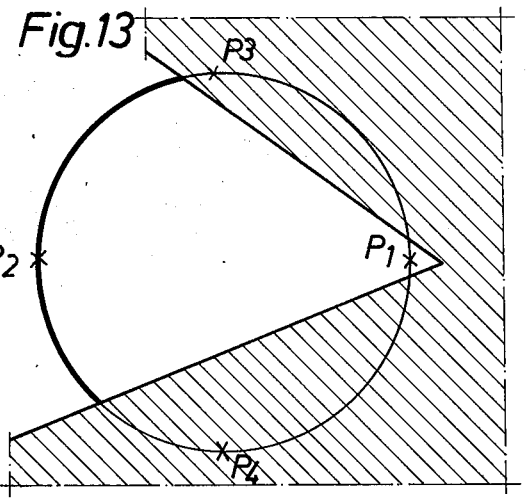
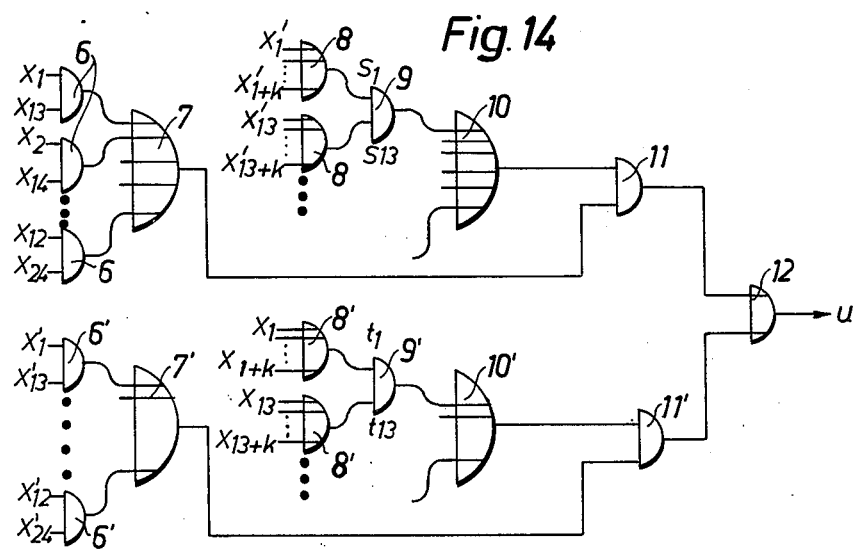
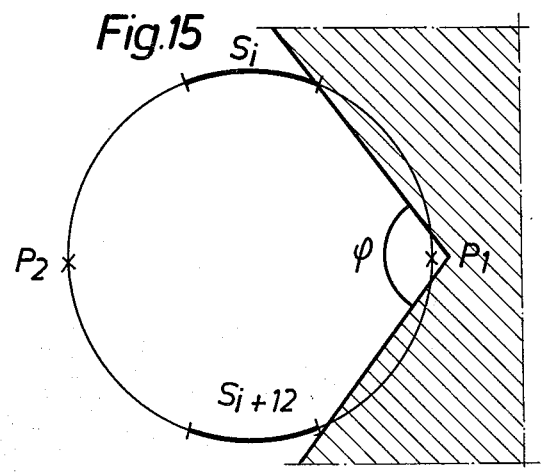

DEVICE FOR EXAMINATION OF DISTANCES IN A PICTURE

The present invention concerns a device for examination and inspection of distances in a picture, more exactly a device for examination and inspection of distances between objects in a two-dimensional, quantized picture where the individual picture elements, or points, have the value 0 or 1 and objects consist of contiguous elements that have the same value.

The invention can be used, for example, to perform automatic inspection of printed circuit boards in the electronic industry. Present-day methods for finding defects in the printed conductor pattern are extremely labor-intensive. Common defects are insufficiently wide conductors and insufficient conductor separation. A device employing the principles of the invention described here can detect and call attention to both of these defects.

The invention is also usable in every other application involving the examination and inspection of distances between objects in a two-dimensional picture that has been quantized, i.e. digitized, according to the above principles. This digitizing can occur, for example, in the scanning of the object to be depicted with a scanner, whose resulting serial digitized information is stored in long shift registers that are read out in parallel during the inspection process. A method according to this principle is described, for example, in U.S. Pat. No. 3,832,687. This method requires that a digitized representation of the entire two-dimensional picture be first created and stored in registers, from which information is then read during the examination process. Another method employs an array of sensors, resembling the human retina, to read and digitize in parallel the information required at each step of the examination process.

The present invention originates from research in the area of picture processing by computer. The literature describes various algorithms which relate to the problem solved by this invention: computation of the Euler number, shrinking and expansion, etc. Labelling of objects is a well-known standard procedure for distinguishing one object from another.

A description of a computer intended for picture processing was published in "The Illinois Pattern Recognition Computer-ILLIAC III," IEEE Trans. Electron. Comput. EC-12, No. 5, 1963, pp. 791–813. ILLIAC III is a general-purpose machine for picture-processing applications, and would require, in order to perform the complete function as performed by the present invention, a program and various supplementary data such as masks and intermediate stored results.

The information processing performed by the present invention can of course be performed by any computer. All such implementations, including those mentioned above, have the disadvantage that this processing cannot be realized in hardware but instead requires a program of some sort. A consequence of this, in the application of printed-circuit inspection, is intolerably long inspection times.

The object of the present invention is thus the realization of a device for inspection and examination of distances between objects in a two-dimensional digitized picture, in such a form that the device contains only basic digital logic components and does not use a computer program for processing of picture information.

The solution by which the present invention realizes this object is characterized by at least one logical unit that for each individual picture element senses the value of points on the periphery of a subpicture associated with the particular individual picture element, with defined geometric form and a size related to the smallest permissible distance between two objects; and further characterized by the inclusion within the logical unit of a device which determines by means of these sensed values whether the closed loop formed by the subpicture's peripheral picture elements included at least two transitions from picture elements with value 0 to picture elements of value 1, in which case the logical unit gives a warning signal.

A device constructed according to the principles of the present invention realizes a speed that exceeds, by several orders of magnitude, that realizable with a general-purpose computer.

Figure 3:
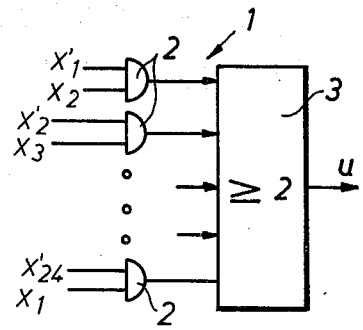
Figure 2:
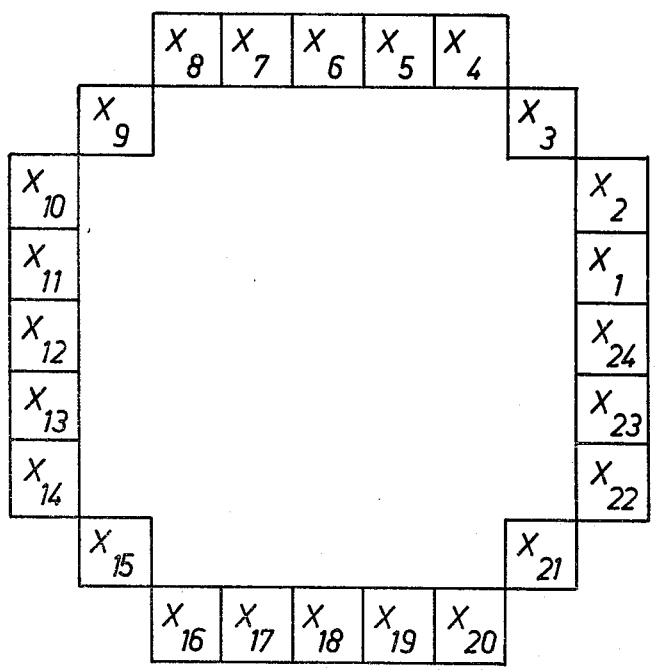
Figure 9:
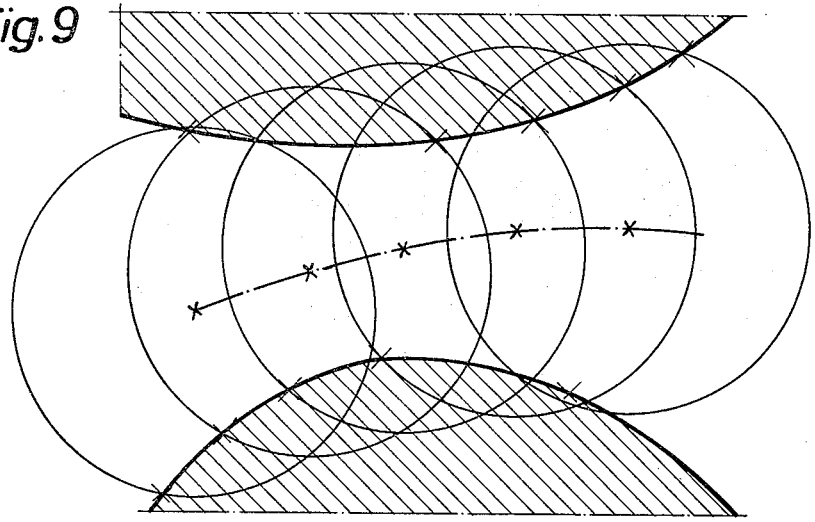
Figure 12:
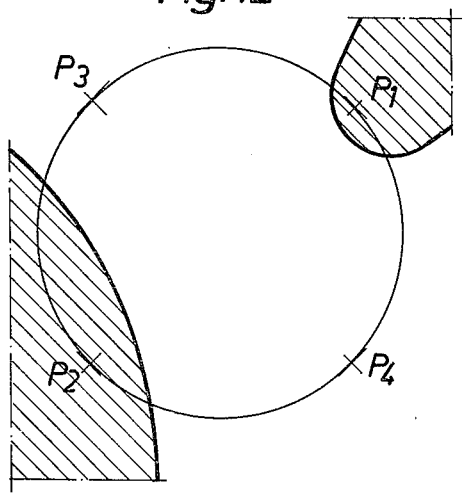
Figure 10:
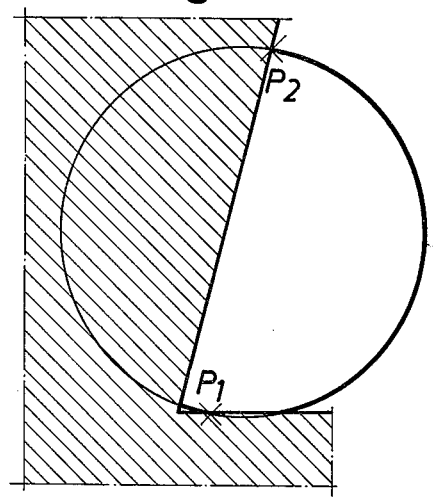
Figure 11:
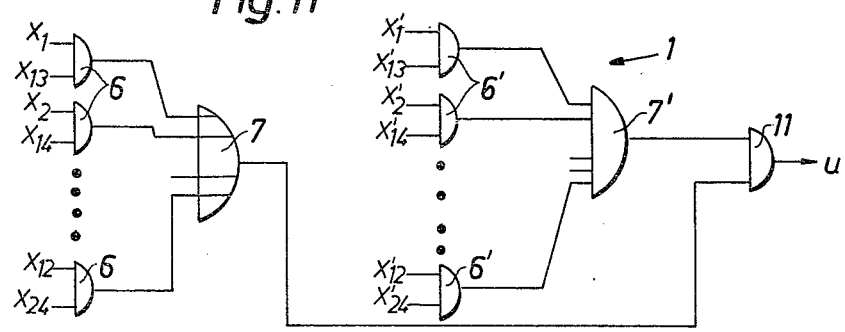
Figure 16:
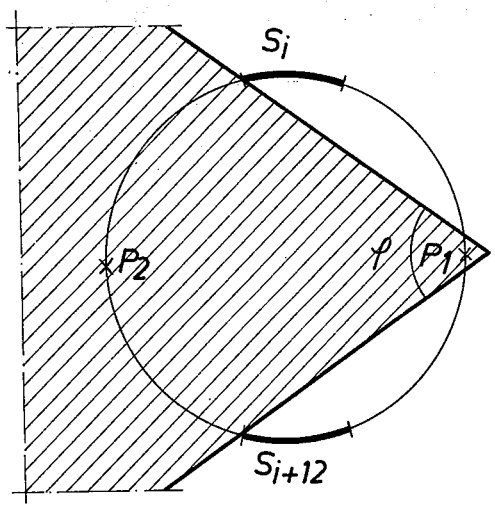
Figure 17:
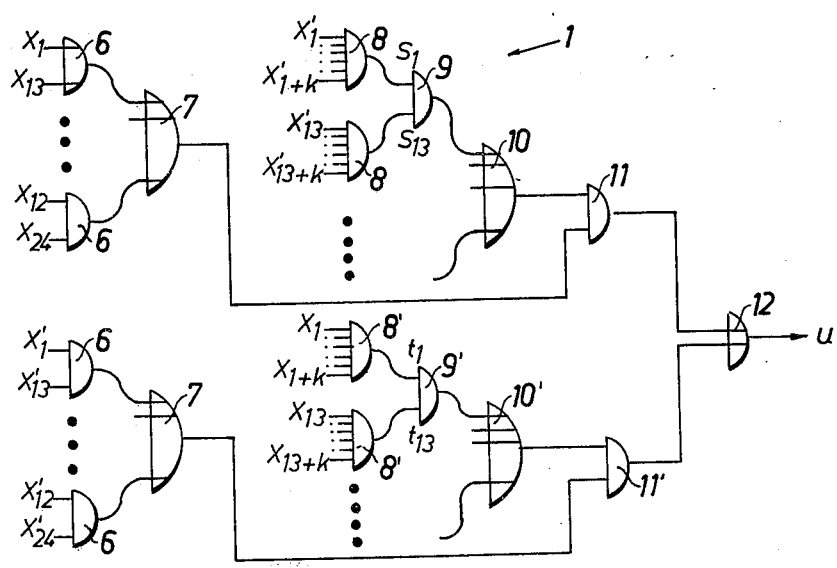
Figure 18:
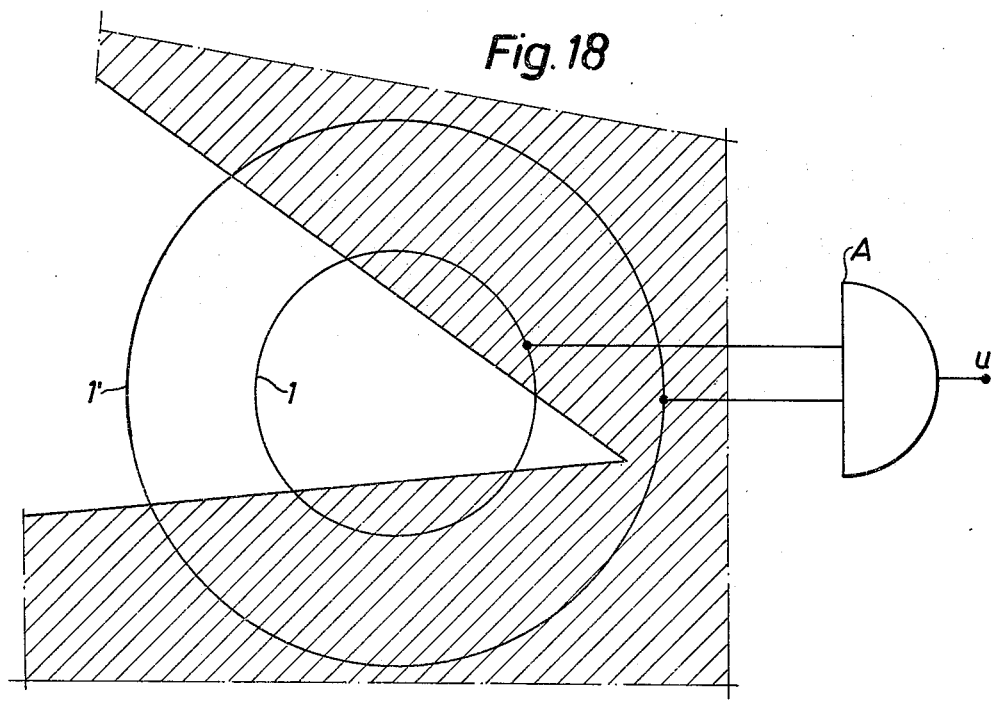
Figure 19:
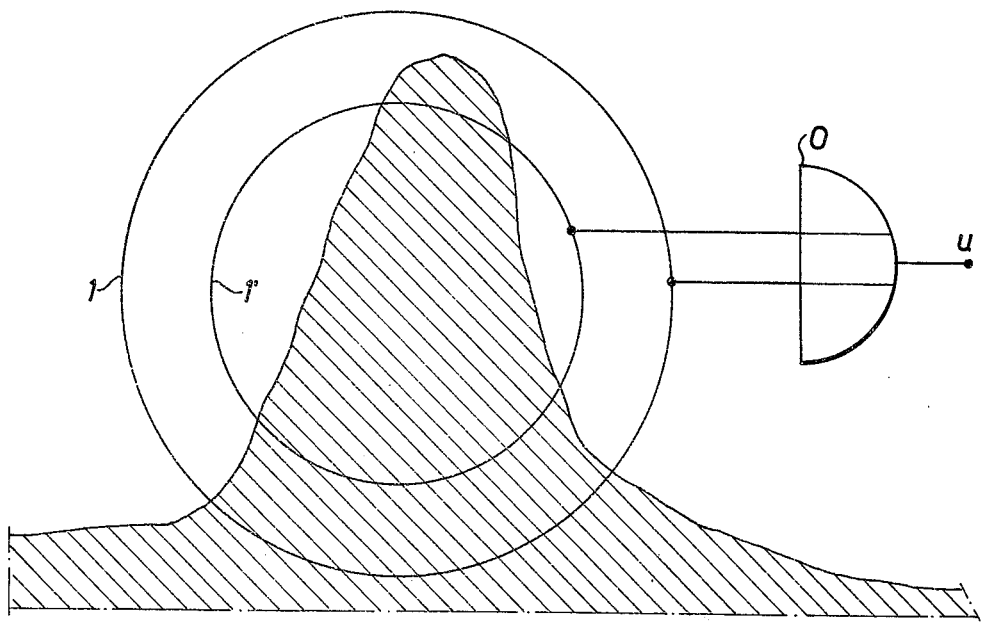

In order to further explain and illustrate the present invention, different realizations and implementations of this invention are described below, with reference to the attached diagrams, of which FIG. 1 shows, in schematic form, the basis for the present invention, FIG. 2 shows one example of the subpicture's geometric form, FIG. 3 shows a first implementation of a device constructed in accordance with the principles of the present invention, FIG. 4 shows how part of the device of FIG. 3 can be constructed, FIG. 5 shows a full adder in schematic form, FIG. 6 shows a truth table for the full adder of FIG. 5, FIG. 7 shows an object with a concavity, FIG. 8 shows a second implementation of a device constructed in accordance with the principles of the present invention, FIG. 9 shows the operation of the device of FIG. 8, FIG. 10 shows an object having a corner in the form of an acute angle FIG. 11 shows a third implementation of a device constructed in accordance with the principles of the present invention, FIG. 12 shows the operation of the device of FIG. 11, FIG. 13 shows another object having a corner in the form of an acute angle FIG. 14 shows a fourth implementation of the invention, FIG. 15 shows how the device of FIG. 14 operates, FIG. 16 shows a wedge-shaped object, FIG. 17 shows a fifth implementation of a device constructed in accordance with the principles of the present invention, FIG. 18 shows, in schematic form, a sixth implementation of the invention, and FIG. 19 shows, in schematic form, a seventh implementation of the invention.

FIG. 1 shows the basis for the present invention. The Figure shows two objects, denoted A and B, which are separated by a background object denoted C. Objects A and B each occupy an area that can be considered to consist of a number of contiguous picture elements, all of which are assigned the predefined value 0 or 1. The background object C can also be considered to consist of a number of contiguous picture elements, in this case with the opposite value from the elements of objects A and B. Thus if the points in objects A and B are assigned the value 1, the points in the background object C will have the value 0. To determine whether the separation between objects A and B is less than a certain distance d, a test circle is placed as shown in the Figure. This test circle is the subpicture mentioned above. The values of the picture elements along the circle's periphery are sensed, and these values are used to determine whether there are at least two transitions from a zero-valued to a one-valued picture element when the circle is traversed in a clockwise (alternatively, counterclockwise) direction. Alternatively the presence of at least two transitions from a one-valued to a zero-valued picture element, when the circle is traversed in a clockwise (alternatively, counterclockwise) direction, may be examined. These two alternative tests are clearly completely equivalent. If the above test shows that there are two such transitions, shown in the Figure as $P_1$ and $P_2$, this means that there must be a point $P_3$ located between $P_1$ and $P_2$, and a point $P_4$ located between $P_2$ and $P_1$, where a transition in the opposite direction occurs. The device constructed according to the present invention will thus give a warning signal for the situation shown in FIG. 1.

By allowing each element in the picture to serve as the subpicture's center point, for example by shifting in both x- and y-directions, one can perform an examination of distances between objects over the entire picture. From the above description it also follows that a warning signal will be given both in the case of two one-valued objects which are closer than distance d to each other, and in the case of two background objects (zero-valued objects) which are closer than distance d to each other. This latter case is equivalent to testing the width of a one-valued object.

FIG. 2 shows an example of how a circle with a diameter of eight picture elements has been adapted to the given picture quantization. 24 picture elements $x_1$–$x_{24}$, arranged along the discrete circle's periphery, have been chosen. The picture element values currently associated with these points are sensed by the aforementioned logical unit, which is described in more detail below, and this data is examined for transitions between adjacent points along the circle as described above. After this examination has been performed either the subpicture or the entire two-dimensional picture is shifted, so that a new subpicture can be examined. This new subpicture has the same geometric form as the original, but is located elsewhere within the large, two-dimensional picture. The number of tests involved in examination of a picture is thus equal to the number of picture elements, or, in other words, each picture element has an associated subpicture.

The discrete circle of FIG. 2 is just an example of a possible geometric form for the subpicture. The function realized in this case is that of a distance test which is independent of orientation. In some cases it can, however, be desirable for the minimal allowed distance to be different in different directions. Thus, spatially discrete subpictures of elliptical, square, rectangular, rhomboidal, hexagonal, and other forms can be relevant.

The following discussion makes reference to the subpicture of FIG. 2, which is circular in form with 24 picture elements along the periphery. Although this subpicture is used as an example in illustrating the operation of the different implementations of the invention's logical unit, it is understood that these various implementations can be used with any of the aforementioned alternative subpicture forms. Furthermore, the number of picture elements along the circle (24) is not significant to the operating principles of these various implementations, in that e.g. another quantization can give a different number of such points. The following discussion assumes that picture elements are located on a square grid. Even here are alternative quantizations, for example hexagonal, possible.

FIG. 3 shows a first implementation of the logical unit of the device embodying the invention. The logical unit 1 includes 24 AND-gates, i.e. the same number as the number of sensed picture elements in the subpicture of FIG. 2. Each AND-gate 2 senses, for each test, both the value of its associated picture element (for example, $x_3$) and the inverted value of the previous picture element ($x'_2$). Alternatively, the inverted value of the following picture element may be sensed instead of that of the previous element. An output signal of value 1 is given by an AND-gate only in the case when both of its input signals (e.g. $x_3$, $x'_2$) are 1, i.e. if there is a transition from a one-valued to a zero-valued picture element in the associated picture elements. The output signals from the AND-gates 2 are fed to an element 3, which tests whether there are at least two 1-valued signals. In this case the element 3 gives a warning signal.

The element 3 may be implemented in many different ways. A direct design is shown in FIG. 4. The output signals $Y_1$, $Y_2$, $Y_3$, . . from the AND-gates 2 are applied, in the manner shown, to different full adders. The symbol for such an adder is shown in FIG. 5, and the adder's function follows from the truth table of FIG. 6. The output signals C from these full adders are connected in parallel to an OR-gate, whose output signal thus corresponds to output signal $\mu$ in FIG. 3.

The logical unit 1 shown in FIG. 3 functions satisfactorily in most cases. Under certain conditions, however, there can be problems. FIG. 7 shows an object A having a concavity K. Here the aforementioned test condition is satisfied by points $P_1$ and $P_2$; thus the device of FIG. 3 will give a warning signal in this case, notwithstanding that this is not a situation involving two object that lie too close to each other but one involving one object that has a concavity.

To avoid the identification of object A in FIG. 7 as two separate objects, the device of FIG. 3 may be modified as in FIG. 8.

FIG. 8 thus represents a second implementation of the device embodying the invention. In this as in the previous variant the picture element signals are applied to AND-gates 2. The output signals from these AND-gates 2 are, however, not applied to an element 3 (as in the implementation of FIG. 3) but instead connected in pairs to AND-gates 4, where the two AND-gates 2 associated with diametrically opposed picture elements form a pair. The output signals from the AND-gates 4 are applied in parallel to an OR-gate 5. The configuration of FIG. 8 gives a warning signal in the case of transitions from zero to one between adjacent picture elements (assuming the test circle to be traversed in a clockwise direction) both at picture element $x_i$ and at picture element $x_{i+12}$, i.e. at two diametrically opposed positions. Thus the case shown in FIG. 7 does not give rise to a warning signal, while the configuration of objects shown in FIG. 9 gives a warning signal in several different position of the test circle.

Even the implementation of FIG. 8 can incorrectly give a warning signal in certain situations. One such case is shown in FIG. 10. This shows a contiguous object having an acute angle (angle less than 90°). As the figure shown there are in fact two diametrically opposed points $P_1$ and $P_2$ where transitions of the type mentioned above occur. In the test position shown, the device of FIG. 8 will thus give a warning signal.

The logical unit 1's third implementation, shown in FIG. 11, can avoid this incorrect interpretation to a certain extent. The logical unit 1 includes a first group of AND-gates 6, which sense the values of the picture elements along the subpicture's perimeter. In this case the number of AND-gates 6 is half of the number of subpicture perimeter elements, and the number of such elements must in this case be even. One input of each AND-gate 6 receives the signal from the gate's associated picture element, where all such associated elements lie along one-half of the subpicture's perimeter. The other input of each AND-gate receives the signal from the picture element diametrically opposite from that connected to the gate's first input. The output signals from the AND-gates 6 are connected to inputs of an OR gate 7, whose output signal goes to one input of an AND-gate 11. The logical unit 1 of FIG. 11 also includes a second group of AND-gates 6'. This group of AND-gates is arranged the same way as the first group, with the difference that all of the inputs to the second group's AND-gates are inverted. The output signals from this second group's AND-gates 6' are connected to inputs of a second OR-gate 7', whose output signal goes to AND-gate 11's other input. The logical unit 1 having this structure gives a warning signal only in the case of at least one diametrically opposed pair each of elements with value 1 ($P_1$ and $P_2$ of FIG. 12) and elements with value 0 ($P_3$, $P_4$).

Even the implementation of FIG. 11 can give "incorrect interpretations" in some cases. The sharp corner shown in FIG. 13 will give rise to such a signal, since the element pairs $P_1$, $P_2$ and $P_3$, $P_4$ satisfy the given conditions. In some cases, however, such "wrong interpretations" are desirable: an example is the detection of objects with corners that are too sharp.

The implementation of the logical unit 1 shown in FIG. 14 represents a generalization of the implementation of FIG. 11. This logical unit, which is a fourth implementation of the device covered by the present invention, has, as does the implementation of FIG. 11, two groups of AND-gates 6, 6' and two OR-gates 7, 7'. These OR-gates' outputs are, however, not connected to a common AND-gate 11 as in FIG. 11, but to one input of the AND-gates 11 and 11' respectively. These AND-gates' other inputs receive the output signals from two logical networks 8, 9, 10 and 8', 9', 10' respectively. The logical network 8, 9, 10 consists of a group of OR-gates 8, such that one OR-gate 8 is associated with each element along the subpicture's periphery. Each OR-gate 8 receives the inverted signal from its associated picture element as well as the inverted signals from k adjacent points along the subpicture's periphery. The logical network 8, 9, 10 also includes a group of AND-gates 9. Each AND-gate 9 receives the outputs of an associated pair of OR-gates 8, such that the two OR-gates of the pair correspond to two diametrically opposed sections of the subpicture. The number of AND-gates 9 is thus half the number of OR-gates 8, which implies that the subpicture's periphery must in this case contain an even number of picture elements. The logical network 8, 9, 10 includes an OR-gate 10, whose inputs receive the output signals from all the AND-gates 9. The logical network 8', 9', 10' has exactly the same structure as the network 8, 9, 10. The only difference between these two networks is that the input signals to the network 8', 9', 10' are not inverted. Finally, the outputs from the AND-gates 11, 11' connect to the two inputs of an OR-gate 12.

The function of the logical unit of FIG. 14 is shown in FIG. 15. A warning signal is given if an opposed pair of points $P_1$, $P_2$ are in the 1 state and an opposed pair of sections $S_i$, $S_{i+12}$ are not entirely in the 1 state, i.e. both $S_i$ and $S_{i+12}$ each contain at least one picture element having value 0; or in the case that an opposed pair of points $P_1$, $P_2$ are in the 0 state and an opposed pair of sections $S_i$, $S_{i+12}$ are not entirely in the 0 state, i.e. both $S_i$ and $S_{i+12}$ each contain at least one element having value 1. The device of FIG. 14 achieves an expansion of the range of angles for which sharp corners are detected. Thus the object of FIG. 15 causes a warning signal if the angle $\phi$ is such that the dashed object with value 1 covers both right-hand endpoints of the section $S_i$ and $S_{i+12}$. The expansion of the range for which sharp corners are detected comes thus from requiring that $S_i$ and $S_{i+12}$ only be opposed sections of the circle's periphery rather than requiring them to be opposed points.

A dual variant to the configuration of FIG. 14 results if the OR-gates 8 and the OR-gates 8' are replaced with AND-gates. FIG. 17 thus shows a fifth implementation of the logical unit embodying the invention, in which such a replacement has been made. This unit gives a warning signal only if an opposed pair of picture elements $P_1$, $P_2$ are in the 1 state and an opposed pair of sections $S_i$, $S_{i+12}$ are in the 0 state, or if an opposed pair of picture elements $P_1$, $P_2$ are in the 0 state and an opposed pair of sections $S_i$, $S_{i+12}$ are in the 1 state. This device will only detect pointed wedges of the tye shown in FIG. 16. By making the sections $S_i$ longer, i.e. by making k larger, the smallest permissible wedge angle $\phi$ may be reduced. The corresponding effect for the device of FIG. 14 is that the smallest permissible angle $\phi$ (FIG. 15) may be increased by lengthening the sections $S_i$.

The above implies that for objects all of whose delimiting lines have radii of curvature greater than the radius of the test circle, no warning signals will be given if no two objects are located closer together than the circle's diameter d.

According to the present invention also several logical units of the described type can be logically connected. By means of such a connection it is possible to eliminate for instance different "incorrect interpretations".

Thus, FIG. 18 shows a part of the large two-dimensional picture, where this part of the picture contains two objects. One of the objects has the form of a wedge, it being apparent that there are two objects of the same type within the closed loop 1. The loop 1 represents a logical unit of the described type. Thus, in this case there would be a warning signal indicating that two objects lie too close to each other, if only loop 1 would be used for the distance examination. However, as is apparent from the figure the present two objects within the loop 1 are really contained in one and the same object. Thus, if loop 1 would have had a larger diameter, for instance the same diameter as loop 1', this warning signal (incorrect interpretation in this case) would have been avoided. According to one embodiment of the invention the two loops 1, 1' with different diameters are arranged within each other and the outputs of these loops are connected to an AND-gate A. Thus, the combined device will emit a warning signal only in the case when both loops at the same time emit warning signals. Thus, the dimensions of the loop 1 are related to the smallest allowable distance between two objects, while the diameter of loop 1' is larger than this distance in order to determine whether separate objects within loop 1 actually are connected outside loop 1'. With this method incorrect interpretations of the shown type can be avoided.

FIG. 19 shows another logical connection of the output signals from two test circles 1, 1' that are lying within each other. In this case these output signals are connected to an OR-gate O. Such a connection is suitable if one wishes to detect also short projections from an object. In this case the critical distance is defined by the larger test circle diameter. Thus, the inner test circle will in all normal situations have no influence on the outsignal of the OR-gate, since two short distances between objects will be detected already by the larger test circle 1. If one is interested in detection of short projections from objects, however, the shown test circle 1 would in this case be insufficient, since there are only two different objects within this circle. By providing also a circle 1' with smaller diameter such projections will also be detected, since the smaller test circle 1' will "see" two objects of the same type lying too close to each other.

It is appreciated that the closed loops 1, 1' do not have to be concentric, but can be displaced and be of different geometric form. It is further appreciated that the invention is not restricted to connection of two loops, but that the number of loops can also be greater than two. Finally it is appreciated that the connections of loops is not restricted to use of AND-gates or OR-gates, but that also combinations of these or other logical elements can be of interest. Thereby warning signals can be obtained from the device according to the invention also for one or several combinations of loop output signals. Here the expression "warning signal" does not necessarily mean only a signal indicating an error, but a warning signal can also possibly mean that the distance examination has given an acceptable result, that one wants to indicate in spite of this fact.

As is clear from the preceding description, the device embodying the principles of the present invention may be modified in many ways. Only a few illustrations of these possibilities have been described here. The invention is thus not to be considered as limited to these examples, illustrations, and implementations; but instead is of an extent as described in the attached claims.

We claim:

1. A device for examination of distances between spaced apart objects in a two-dimensional quantized picture, of which the individual picture elements are assigned the values 0 and 1 and objects consist of contiguous elements having the same value; characterized by at least one logical unit (1) which for each individual picture element senses the values of the peripheral picture elements ($x_i$) of a subpicture of defined geometric form associated with the individual picture element, where this subpicture is of a size related to the smallest allowable distance between two objects; further characterized by the logical unit's (1) including logical elements (2-12) which by means of the sensed values determine whether, on a closed loop formed by the subpicture's peripheral elements ($x_i$), there are at least two transitions from a picture element with value 0 to an element with value 1, and with the logical unit (1) giving a warning signal only if at least two such transitions appear.

2. A device in accordance with claim 1, characterized by the subpicture's periphery consisting of a circle that has been adapted to the quantization of picture elements.

3. A device in accordance with claim 1, characterized by the subpicture's periphery consisting of an ellipse that has been adapted to the quantization of picture elements.

4. A device in accordance with claim 1, characterized by the subpicture's periphery consisting of a square that has been adapted to the quantization of picture elements.

5. A device in accordance with one of the previous claims, characterized by the inclusion of a number of AND-gates (2) corresponding to the number of picture elements ($x_i$) in the closed loop, whose outputs are connected to an element (3) which gives a warning signal if at least 2 AND-gates (2) give an output value of 1, where each AND-gate's (2) one input receives the signal from an associated picture element ($x_i$) in the loop, and each AND-gate's (2) other input receives the inverted signal from the picture element immediately before or after the associated picture element (FIG. 3).

6. A device in accordance with claim 5, characterized by the element's (3) inclusion of serially-connected full adders (FA), whose three input signals consist of two associated AND-gates' (2) output signals ($Y_1, Y_2, Y_3, \ldots$) and the signal from the previous full adder's sum output (S), except for the first full adder's (FA) third input which is connected to a third associated AND-gate's (2) output ($Y_1$), and whose carry output signals (C) are all connected to corresponding inputs of a common OR-gate.

7. A device in accordance with one of the claims 1-4, characterized by the inclusion of a number of AND-gates (2) corresponding to the number of picture elements in the closed loop, which in this case is even, where each AND-gate's (2) one input receives the signal from an associated picture element ($x_1$) in the loop, and each AND-gate's other input receives the inverted signal from the picture element immediately before or after the associated picture element ($X_i$), and by the connection of each AND-gate's output and the output from the corresponding most remotely located AND-gate (in terms of the number of picture elements along the loop) to the two inputs of an AND-gate (4), where these latter AND-gates' (4) output signals are connected to an OR-gate (5) (FIG. 8).

8. A device in accordance with one of the claims 1-4, characterized by a number of first AND-gates (6) corresponding to half the number of picture elements in the closed loop, which in this case is even, where each AND-gate's (6) one input receives the signal from an associated picture element ($x_i$) located within one half of the loop, and each AND-gate's other input receives the signal from the corresponding most remotely located picture element ($X_{i+12}$) in terms of number of points along the loop; by the AND-gates' (6) outputs' being connected to a first OR-gate (7); by a number of second AND-gates (6') corresponding to the aforementioned number of picture elements, where every second AND-gate's (6') one input receives the inverted signal from an associated picture element ($x_i$), and every second AND-gate's (6') other input receives the inverted signal from the corresponding most remotely located picture element ($X_{i+12}$) in terms of numbers of points along the loop; by the second AND-gates' (6') outputs' being connected to a second OR-gate (7'); and by the two OR-gates' (7, 7') outputs' being connected to the two inputs of an AND-gate (11) (FIG. 11).

9. A device in accordance with one of the claims 1-4, characterized by a first group of AND-gates (6) corresponding in number to half of the even number of picture elements along the closed loop, where the AND-gates' (one input receives the signal from an associated picture element along one half of the closed loop and the other input receives the signal from the corresponding most remotely located picture element, in terms of number of elements along the loop; by a first OR-gate (7) whose inputs receive the outputs of the aforementioned AND-gates (6); by a second group of AND-gates (6') corresponding in number to half the number of picture elements along the closed loop, where the AND-gates' (6') one input receives the inverted signal from an associated picture element along one half of the closed loop and the other input receives the signal from the corresponding most remotely located picture element, in terms of number of elements along the loop; by a second OR-gate (7') whose inputs receive the outputs of the AND-gates (6'); by a first group of logical elements (8) corresponding in number to the number of picture elements along the closed loop, where one input of each legical element (8) receives the inverted signal from an associated picture element along the loop and the remaining inputs receive the inverted signals from a predetermined number k of adjacent picture elements; by a third group of AND-gates (9) to which the outputs of the logical elements (8) are connected in pairs, with each pair consisting of the logical elements (8) corresponding to two picture elements which are farthest apart from each other in terms of number of picture elements along the loop; by a third OR-gate (10) to which the outputs of the AND-gates (9) in the third group are connected; by a first individual AND-gate (11) whose one input receives the output of the first OR-gate (7) and whose other input receives the output of the third OR-gate (10); by a second group of logical elements (8') corresponding in number to the number of picture elements along the closed loop, where one input of each logical element (8') receives the signal from an associated picture element along the loop and the remaining inputs receive the signals from a predetermined number k of adjacent picture elements; by a fourth group of AND-gates (9') to which the outputs of the logical elements (8') of the second group are connected in pairs, with each pair consisting of the logical elements (8') of the second group that correspond to two picture elements which are farthest apart from each other in terms of number of picture elements along the loop; by a fourth OR-gate (10') to which the outputs of the AND-gates (9') in the fourth group are connected; by a second individual AND-gate (11') whose one input receives the output of the second OR-gate (7') and whose other input receives the output of the fourth OR-gate (10'); and by a fifth OR-gate (12) whose two inputs receive the outputs of the two individual AND-gates (11, 11') (FIGS. 14, 17).

10. A device in accordance with claim 9, characterized by the implementation of the logical elements (8, 8') as OR-gates (FIG. 14).

11. A device in accordance with claim 9, characterized by the implementation of the logical elements (8, 8') as AND-gates (FIG. 17).

12. A device in accordance with one of claims 1-4, characterized in several logical units (1, 1'), each belonging to its own closed loop, that is formed by the peripheral picture elements to the subpicture formed by the loop, each logical unit (1, 1') testing whether there are at least two transitions from a picture element with value 0 to an element with value 1 on the corresponding loop and each logical unit (1, 1') giving off a warning signal only if at least two such transitions appear, and each of the output signals from the logical units (1, 1') being connected to a logical element (A, O) that gives off a final warning signal only if one or several predetermined combinations of output signals from the logical units (1, 1') appear at its inputs.

13. A device according to claim 12, characterized in that the logical element comprises an AND-gate (A).

14. A device according to claim 12, characterized in that the logical element comprises an OR-gate (O).

* * * * *